United States Patent [19]

Vorenkamp et al.

[11] Patent Number: 5,298,801
[45] Date of Patent: Mar. 29, 1994

[54] TRACK-AND-HOLD CIRCUIT

[75] Inventors: Pieter Vorenkamp; Johannes P. M. Verdaasdonk, both of Eindhoven, Netherlands

[73] Assignee: U.S. Philips Corporation, New York, N.Y.

[21] Appl. No.: 938,921

[22] Filed: Aug. 31, 1992

[30] Foreign Application Priority Data

Sep. 11, 1991 [EP] European Pat. Off. ........ 91202332.2

[51] Int. Cl.$^5$ .............................................. G11C 27/02
[52] U.S. Cl. .................................... 307/353; 307/494
[58] Field of Search ............ 307/352, 353, 355, 491, 307/494; 328/151

[56] References Cited

U.S. PATENT DOCUMENTS

| | | | |
|---|---|---|---|
| 4,617,474 | 10/1986 | Jason | 307/494 |
| 4,721,865 | 1/1988 | Tallaron et al. | 328/151 |
| 5,039,878 | 8/1991 | Armstrong et al. | 307/355 |
| 5,047,666 | 9/1991 | Astegher et al. | 307/494 |
| 5,134,309 | 7/1992 | Matsumoto et al. | 307/494 |
| 5,134,318 | 7/1992 | Itoh | 307/491 |
| 5,168,209 | 12/1992 | Thiel, V | 307/491 |
| 5,223,743 | 6/1993 | Nakagawara | 307/491 |

Primary Examiner—John T. Kwon
Attorney, Agent, or Firm—Bernard Franzblau

[57] ABSTRACT

A track-and-hold circuit includes an input stage (IS), an output stage (OS) and a switching stage (SS). The switching stage is coupled between the input stage and the output stage. The switching stage includes a switching transistor (T10), a differential amplifier (T11/T12), a current source (T13/R11), and a capacitor (C11). In order to improve the frequency response, the input stage is provided with a passive impedance coupled between a base of the switching transistor and a first supply terminal (1) and the input stage is adapted to supply a signal current to the base of the switching transistor. This signal current is related to an input signal applied to the input stage. The output stage includes a first output transistor (T14), a first current source (T15) switched by a tracking signal (Vt), a second output transistor (T16), and a second current source.

19 Claims, 1 Drawing Sheet

TRACK-AND-HOLD CIRCUIT

BACKGROUND OF THE INVENTION

This invention relates to a track-and-hold circuit comprising an input stage coupled to an input terminal for receiving an input signal, an output stage coupled to an output terminal for supplying an output signal, and a switching stage coupled between the input stage and the output stage. The switching stage comprises a switching transistor having a base coupled to the input stage, a collector coupled to a first supply terminal, and having an emitter coupled to the output stage, a differential amplifier having a first input for receiving a hold signal, a second input for receiving a tracking signal, a common terminal coupled to a second supply terminal by means of a current source, a first output coupled to the base of the switching transistor, and having a second output coupled to the emitter of the switching transistor, and a capacitor coupled between the emitter of the switching transistor and one of the supply terminals.

Such a track-and-hold circuit can be used in, for example, an analog-to-digital converter.

Such a track-and-hold circuit has a tracking mode, in which the switching transistor is in a conductive state as a result of the tracking signal applied to the differential amplifier, and a hold mode, in which the switching transistor is in a cut-off state as a result of the hold signal applied to the differential amplifier. Owing to the state of the switching transistor the output signal in the tracking mode is dictated by the input signal and the output signal in the hold mode is dictated by a voltage built up across the capacitor during the tracking mode. As in the hold mode the voltage built up across the capacitor decreases as a result of an input current required by the output stage, the tracking signal and the hold signal are limited by a minimum frequency imposed by the input current.

Such a track-and-hold circuit is known from, inter alia, Japanese Kokai 63-119100, the track-and-hold circuit described in said Kokai having an input stage comprising at least one pnp transistor having a base coupled to the input terminal, a collector coupled to the second supply terminal, and having an emitter coupled to the base of the switching transistor, and a current source coupled between the base of the switching transistor and the first supply terminal. By means of the pnp transistor the input stage produces a control voltage for the switching stage, which voltage is related to the input signal, which is limited by a maximum frequency imposed by the pnp transistor.

SUMMARY OF THE INVENTION

It is an object of the invention to provide a track-and-hold circuit which is improved with respect to at least one of the above-mentioned frequency limitations.

To accomplish the above object a track-and-hold circuit according to the invention may be characterised in that the differential input stage comprises a passive impedance coupled between the base of the switching transistor and the first supply terminal, and the input stage is adapted to supply a signal current to the base of the switching transistor, which signal current is related to the input signal applied to the input terminal. In contradistinction to the switching stage described in the Japanese Kokai, which stage is controlled by means of a signal voltage, the switching stage in accordance with the invention is controlled by means of the signal current. Therefore, the pnp transistor used in the Japanese Kokai may be replaced by a controlled signal current source, which signal current source can be constructed, for example, as an npn transistor. Since the at least one pnp transistor has been dispensed with the track-and-hold circuit in accordance with the invention can be realised exclusively by means of npn transistors, so that the maximum frequency imposed by the transistors is comparatively high. The passive impedance has been included in the input stage because both the signal current source and the switching stage require a current supply.

To accomplish the above object a track-and-hold circuit according to the invention may be characterised in that the output stage comprises a first output transistor having a base coupled to the emitter of the switching transistor, a collector coupled to the first supply terminal, and having an emitter coupled to the second supply terminal, a first current source switched by the tracking signal and coupled between the emitter of the first output transistor and the second supply terminal, a second output transistor having a base coupled to the emitter of the first output transistor, a collector coupled to the first supply terminal, and having an emitter coupled to the output terminal and to the second supply terminal, and a second current source coupled between the emitter of the second output transistor and the second supply terminal. As the first current source is switched by means of the tracking signal the first current source only supplies a bias current for the first output transistor during the tracking mode. In the tracking mode the first output transistor therefore requires a base current related to the bias current supplied by the first current source and in the hold mode the first output transistor requires a base current related to a bias current supplied by the second current source, the first-mentioned base current being larger than the last-mentioned base current by the current-gain factor of the second output transistor. As a result of the smaller base current the voltage built up across the capacitor decreases in a time interval which is longer in proportion to the current gain factor, as a result of which longer time the minimum frequency dictated by the base current is comparatively low.

A first embodiment of a track-and-hold circuit in accordance with the invention may be characterised in that the input stage, the output stage and the switching stage are differential stages. Since the present embodiment is of the differential type the differential output signal is exempt from disturbing influences as a result of, for example, switching of the switching transistors, the occurrence of disturbances on the supply terminals, a diminution of the voltages built up across the capacitors, and the occurrence of hold-mode feedthrough. The hold-mode feedthrough is caused by a parasitic capacitance between the base and the emitter of the switching transistors.

A second embodiment of a track-and-hold circuit in accordance with the invention may be characterised in that the input stage comprises a degenerate differential amplifier having a first and a second input coupled to the respective input terminals for receiving a differential input signal, a common terminal coupled to the second supply terminal by means of a current source, and having a first and a second output coupled to the bases of the respective switching transistors, and the respective passive impedances each comprising a resistor arranged in series with a unidirectional element. Since the switching stage in accordance with the invention is supplied with a signal current, the input stage should be provided with a linear voltage-to-current converter if the input signal is an input voltage, the present embodiment being an advantageous version of such a voltage-to-current converter. Since the input stage comprises the unidirectional elements the unidirectional elements compensate for a distortion introduced by the degenerate differential amplifier.

A third embodiment of a track-and-hold circuit in accordance with the invention may be characterised in that the switching stage is provided with a first and a second feedforward capacitor, which first feedforward capacitor is coupled between the emitter of the one switching transistor and the base of the other switching transistor, and which second feedforward capacitor is coupled between the emitter of the other switching transistor and the base of the one switching transistor. The hold-mode feedthrough caused by the parasitic capacitance is compensated because the feedforward capacitor coupled between the emitter of the one switching transistor and the base of the other switching transistor receives a drive opposed to the drive of the parasitic capacitance between the base and the emitter of the switching transistor.

BRIEF DESCRIPTION OF THE DRAWINGS

The above and other (more detailed) features of the invention will be described more elaborately with reference to the accompanying drawing, in which.

DESCRIPTION OF THE PREFERRED EMBODIMENTS

Figure 1:
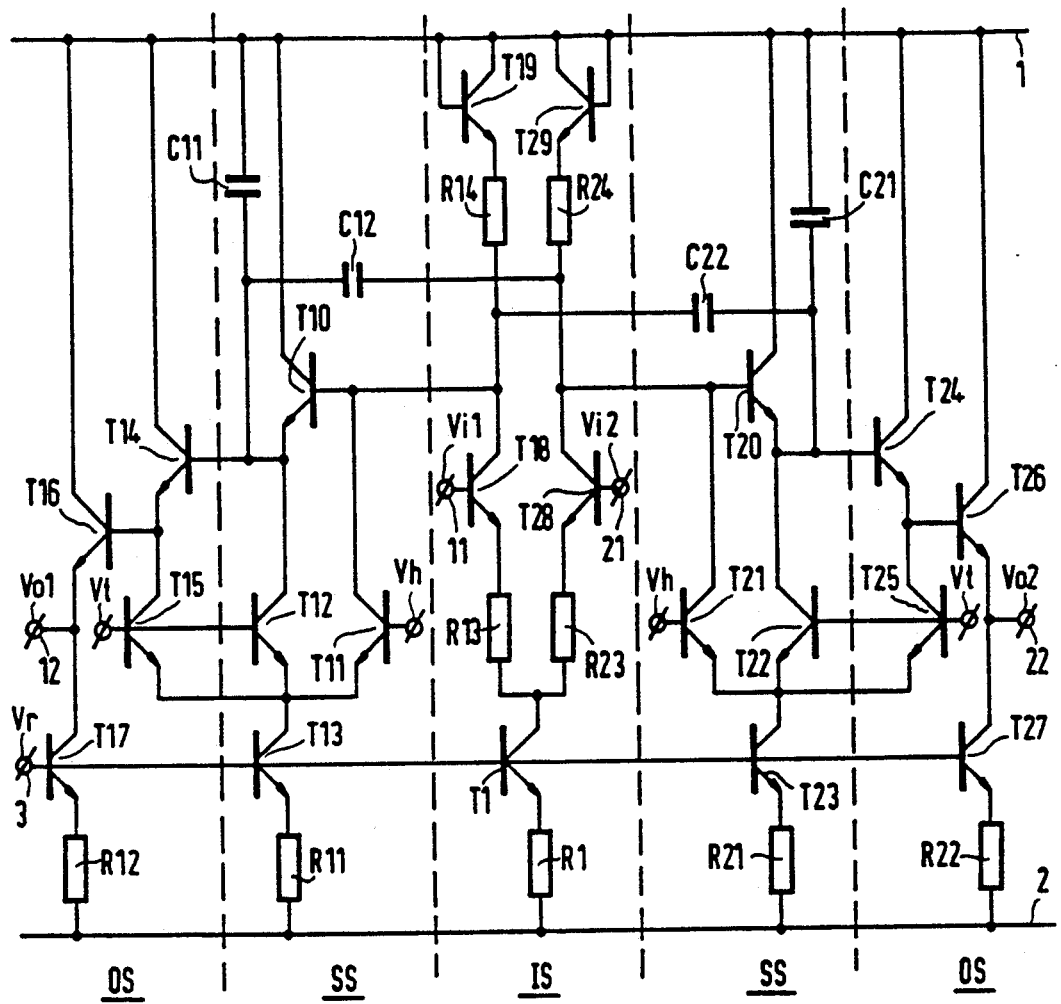
FIG. 1 shows a differential embodiment of a track-and-hold circuit in accordance with the invention.

FIG. 1 shows a differential embodiment of a track-and-hold circuit in accordance with the invention, in which a differential switching stage SS is coupled at one side to a differential input stage IS having an input terminal 11 and an input terminal 21 for receiving a differential input signal Vi1−Vi2 and at the other side to a differential output stage OS having an output terminal 12 and an output terminal 22 for supplying a differential output signal Vo1−Vo2.

The differential switching stage SS comprises two similarly constructed sections. The first section of the differential switching stage SS comprises a switching transistor T10 having a base coupled to the input stage IS, having a collector coupled to a first supply terminal 1, and having an emitter coupled to the output stage OS, a differential amplifier T11/T12 having a first input for receiving a hold signal Vh, having a second input for receiving a tracking signal Vt, having a common terminal coupled to a second supply terminal 2 by means of a current source T13/R11, having a first output coupled to the base of the switching transistor T10, and having a second output coupled to the emitter of the switching transistor T10. A capacitor C11 is coupled between the emitter of the switching transistor T10 and the supply terminal 1. The second section of the differential switching stage SS comprises a switching transistor T20 having a base coupled to the input stage IS, having a collector coupled to the first supply terminal 1, and having an emitter coupled to the output stage OS, a differential amplifier T21/T22 having a first input for receiving the hold signal Vh, having a second input for receiving the tracking signal Vt, having a common terminal coupled to the second supply terminal 2 by means of a current source T23/R21, having a first output coupled to the base of the switching transistor T20, and having a second output coupled to the emitter of the switching transistor T20 a capacitor C21 is coupled between the emitter of the switching transistor T20 and the supply terminal 1.

In the present embodiment the differential input stage IS comprises two passive impedances respectively coupled between the bases of the switching transistors T10 and T20 and the first supply terminal 1. The input stage IS is adapted to supply a signal current to the bases of the switching transistors T10 and T20, which signal current is related to the differential input signal Vi1−Vi2 applied to the input terminals 11 and 21. As a result of the passive impedances and the signal current applied to the switching stage SS, the track-and-hold circuit in accordance with the invention can be realised without the use of pnp transistors, which allows the circuit to operate with an input signal having a comparatively high maximum frequency. For supplying the signal current the input stage IS comprises a degenerate differential amplifier T18/T28/R13/R23 having a first and a second input respectively coupled to the input terminals 11 and 12 for receiving the differential input signal Vi1−Vi2, having a common terminal coupled to the second supply terminal by means of a current source T1/R1, and having a first and a second output coupled to the bases of the respective switching transistors T10 and T20. The degenerate differential amplifier is constructed by means of two npn transistors T18 and T28 and two emitter resistors R13 and R23, and the respective passive impedances each comprising a resistor R14 and R24 respectively arranged in series with a unidirectional element T19 and T29, respectively.

In the same way as the differential switching stage SS the differential output stage OS comprises two similarly constructed sections. The first section of the differential output stage OS comprises a first output transistor T14 having a base coupled to the emitter of the switching transistor T10, having a collector coupled to the first supply terminal 1, and having an emitter coupled to the second supply terminal 2. A current source T15 is switched by the tracking signal Vt and coupled between the emitter of the first output transistor T14 and the common terminal of the differential amplifier T11/T12. A second output transistor T16 has a base coupled to the emitter of the first output transistor T14, a collector coupled to the first supply terminal 1, and an emitter coupled to the output terminal 12 and to the second supply terminal 2. A current source T17/R12 is coupled between the emitter of the second output transistor T16 and the second supply terminal 2. The second section of the differential output stage OS comprises a first output transistor T24 having a base coupled to the emitter of the switching transistor T20, having a collector coupled to the first supply terminal 1, and having an emitter coupled to the second supply terminal 2. A current source T25 is switched by the tracking signal Vt and is coupled between the emitter of the first output transistor T24 and the common terminal of the differential amplifier T21/T22. A second output transistor T26 has a base coupled to the emitter of the first output transistor T24, a collector coupled to the first supply terminal 1, and an emitter coupled to the output terminal 22 and to the second supply terminal 2. A current source T27/R22 is coupled between the emitter of the second output transistor T26 and the second supply terminal 2. In the same way as the current sources T1/R1, T13, R11, T23/R21 and T17/R12, the current source T27/R22 comprises a transistor and an emitter resistor, the transistor having a control electrode coupled to a reference terminal 3 for receiving a reference voltage Vr, and a main current path coupled between the respective common terminal or respective emitter and the supply terminal 2.

The differential construction of the track-and-hold circuit in accordance with the invention operates as follows. The degenerate differential amplifier T18/T28/R13/R23 converts the differential input signal Vi1−Vi2 applied to the input stage IS into a differential current drive for the switching stage SS, a distortion introduced by the base-emitter junctions comprised in the degenerate differential amplifier T18/T28/R13/R23 being compensated for by the base-emitter junctions comprised in the unidirectional elements T19 and T29. Owing to the unidirectional elements, which are formed by a diode-coupled transistor T19 and a diode-coupled transistor T29, the input stage IS provides a substantially linear voltage-to-current conversion. Depending on the instantaneous mode of the track-and-hold circuit the differential current drive applied to the switching stage SS is transferred to the output stage OS, the mode being dictated by the switching stage SS. The mode set by the switching stage can be a tracking mode or a hold mode, in which tracking mode the switching transistors T10 and T20 are in a conductive state as result of the tracking signal Vt applied to the differential amplifiers T11/T12 and T21/T22, and in which hold mode the switching transistors T10 and T20 are in a cut-off mode as a result of the hold signal Vh applied to the differential amplifiers T11/T12 and T21/T22, the tracking signal being larger than the hold signal in the tracking mode and the tracking signal being smaller than the hold signal in the hold mode in the present embodiment. As a result of the state of the switching transistors T10 and T20 the differential output signal Vo1−Vo2 in the tracking mode is dictated by the input signal and the output signal Vo1−Vo2 in the hold mode is dictated by a voltage built up across the capacitor during the tracking mode, which voltage decreases as a result of a differential input current required by the output stage. In accordance with the invention the decrease of the voltage is minimised in that the output stage OS is provided with first current sources switched by the tracking signal Vt, which first current sources are formed by the transistors T15 and T25 respectively. As the first current sources are switched by means of the tracking signal Vt the first current sources only supply a bias current to the first output transistors T14 and T24 in the tracking mode. In the tracking mode the first output transistors T14 and T24 consequently require a base current related to the bias current supplied by the first current sources and in the hold mode the first output transistors require a base current related to the bias current supplied by the second current sources T17/R12 and T27/R22, the first-mentioned base current being larger than the last-mentioned base current by the current-gain factor of the second output transistors T16 and T26. As a result of the smaller base current the voltage built up across the capacitors C11 and C12 decreases in a time which is longer in proportion to the current gain factor, as a result of which longer time the minimum frequency dictated by the base current is comparatively low.

An advantage of the differential construction of the track-and-hold circuit in accordance with the invention is that the differential signals appearing in the circuit are exempt from disturbing influences arising as a result of, for example, switching of the switching transistors T10 and T20, the occurrence of disturbances on the supply terminals 1 and 2, and a decrease of the voltages built up across the capacitors C11 and C21. Another advantage of the differential track-and-hold circuit in accordance with the invention is that the occurrence of hold-mode feedthrough can be compensated. Hold-mode feedthrough is the effect that in the hold mode the input signal Vi1−Vi2 influences the output signal Vo1−Vo2, which is caused by a parasitic capacitance between the base and the emitter of the switching transistors T10 and T20. In the present differential embodiment the hold-mode feedthrough is substantially compensated for by providing the track-and-hold circuit with a first and a second feedforward capacitor C12 and C22 respectively, which first feedforward capacitor C12 is coupled between the emitter of the one switching transistor T10 and the base of the other switching transistor T20, and which second feedforward capacitor C22 is coupled between the emitter of the other switching transistor T20 and the base of the one switching transistor T10. The hold-mode feedthrough caused by the parasitic capacitance is compensated for in that the feedforward capacitor coupled between the emitter of the one switching transistor and the base of the other switching transistor receives a drive opposite to the drive of the parasitic capacitance between the base and the emitter of the switching transistor.

Figure 2:
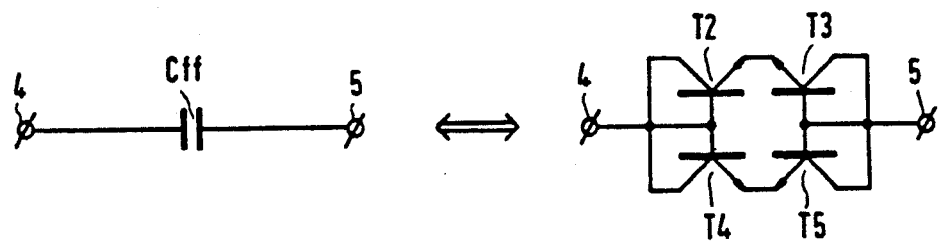
FIG. 2 shows an advantageous example of a feedforward capacitor.

FIG. 2 shows an advantageous form of a feedforward capacitor Cff having a first terminal 4 and a second terminal 5. The advantageous form of the feedforward capacitor Cff is constructed by means of two circuits coupled in parallel, a first circuit comprising a first pair of unidirectional elements (T2, T3) coupled in series opposition, and a second circuit comprising a second pair of unidirectional elements (T4, T5) coupled in series opposition. The first pair of unidirectional elements (T2, T3) comprises a transistor T2 and a transistor T3 and the second pair of unidirectional elements comprises a transistor T4 and a transistor T5, which transistors T2, T3, T4 and T5 each have a mutually coupled base and collector and an emitter, the mutually coupled bases and collectors of the transistors T2 and T4 being coupled to the terminal 4, the emitters of the transistors T2 and T3 being coupled to one another and the emitters of the transistors T4 and T5 being coupled to one another, the mutually coupled bases and collectors of the transistors T3 and T5 being coupled to the terminal 5.

As already stated in the description with reference to FIG. 1, the hold-mode feedthrough can be substantially compensated for when the feedforward capacitors are selected to be identical to the parasitic base-emitter capacitors of the switching transistors T10 and T20. Therefore, the hold-mode feedthrough capacitors are implemented by means of the transistors T2, T3, T4 and T5, the first and the second circuit each having a capacitance equal to half the base-emitter capacitance of the switching transistors. Since the first and the second circuit are coupled parallel to one another the overall capacitance between the terminals 4 and 5 is substantially equal to the base-emitter capacitance of the switching transistors.

The invention is not limited to the embodiments shown herein. Within the scope of the invention several modifications will be obvious to those skilled in the art. For example, the capacitors coupled between the bases of the switching transistors and the first supply terminal may be coupled between the bases of the switching transistors and the second supply terminal. Another modification conceivable to the expert is, for example, the mutual coupling of the common terminals of the respective differential amplifiers of the switching stage, in which case the respective current sources may be combined.

We claim:

1. A track-and-hold circuit comprising an input stage coupled to an input terminal for receiving an input signal (Vi1), an output stage coupled to an output terminal for supplying an output signal (Vo1), and a switching stage coupled between the input stage and the output stage, the switching stage comprising a switching transistor having a base coupled to the input stage, having a collector coupled to a first supply terminal, and having an emitter coupled to the output stage, a differential amplifier having a first input for receiving a hold signal (Vh), having a second input for receiving a tracking signal (Vt), having a common terminal coupled to a second supply terminal by means of a current source, having a first output coupled to the base of the switching transistor, and having a second output coupled to the emitter of the switching transistor, and a capacitor coupled between the emitter of the switching transistor and one of the supply terminals, characterised in that the input stage comprises a passive impedance coupled between the base of the switching transistor and the first supply terminal, and the input stage is adapted to supply a signal current to the base of the switching transistor, which signal current is related to the input signal applied to the input terminal.

2. A track-and-hold circuit as claimed in claim 1, wherein the output stage comprises a first output transistor having a base coupled to the emitter of the switching transistor, having a collector coupled to the first supply terminal, and having an emitter coupled to the second supply terminal, a first current source switched by the tracking signal (Vt) and coupled between the emitter of the first output transistor and the second supply terminal, a second output transistor having a base coupled to the emitter of the first output transistor, having a collector coupled to the first supply terminal, and having an emitter coupled to the output terminal and to the second supply terminal via a second current source coupled between the emitter of the second output transistor and the second supply terminal.

3. A track-and-hold circuit as claimed in claim 1, wherein the input stage, the output stage and the switching stage comprise differential stages.

4. A track-and-hold circuit as claimed in claim 3, wherein input stage comprises a degenerate differential amplifier having a first and a second input coupled to the respective input terminals for receiving a differential input signal (Vi1, Vi2), having a common terminal coupled to the second supply terminal by means of a current source, and having a first and a second output coupled to the bases of respective switching transistors, and the respective passive impedances each comprising a resistor connected in series with a respective unidirectional element.

5. A track-and-hold circuit as claimed in claim 3, wherein common terminals of respective differential amplifiers of the switching stage are coupled to one another, and current sources are combined.

6. A track and hold circuit as claimed in claim 3, wherein the switching stage comprises a second switching transistor having a base coupled to the input stage, a collector coupled to the first supply terminal, and having an emitter coupled to the output stage wherein the input stage comprises a voltage to current converter including a degenerate differential amplifier having first and second inputs coupled to respective input terminals of the circuit which receive a differential input signal, first and second outputs coupled to respective bases of the first and second switching transistors, respectively, and a current source coupling a common terminal of the degenerate differential amplifier to the second supply terminal, and first and second passive impedances coupled respectively between the respective bases of the first and second switching transistors and the first supply terminal.

7. A track and hold circuit as claimed in claim 3, wherein all transistors of the circuit comprise NPN transistors.

8. A track-and-hold circuit as claimed in claim 4, which further comprises a first and a second feedforward capacitor, the first feedforward capacitor being coupled between the emitter of the one switching transistor and the base of the other switching transistor, and the second feedforward capacitor being coupled between the emitter of the other switching transistor and the base of the one switching transistor.

9. A track-and-hold circuit as claimed in claim 4, wherein common terminals of respective differential amplifiers of the switching stage are coupled to one another, and current sources are combined.

10. A track and hold circuit as claimed in claim 6, further comprising a first feedforward capacitor coupled between the emitter of the first switching transistor and the base of the second switching transistor and a second feedforward capacitor coupled between the emitter of the second switching transistor and the base of the first switching transistor.

11. A track-and-hold circuit as claimed in claim 8, wherein the first and the second feedforward capacitor each comprise two circuits coupled in parallel, which circuits each comprise a second pair of unidirectional elements coupled in series opposition.

12. A track and hold circuit as claimed in claim 6, wherein the differential output stage comprises, first and second output transistors coupled to the first and second switching transistors, respectively, first and second current sources switchable by the tracking signal and coupling the first and second output transistors, respectively, to the second supply terminal, third and fourth output transistors coupling the first and second output transistors, respectively, to first and second output terminals, respectively, of the track and hold circuit, and third and fourth current sources coupling the third and fourth output transistors, respectively, to the second supply terminal.

13. A track-and-hold circuit comprising: an input stage coupled to an input terminal for receiving an input signal (Vi1), an output stage coupled to an output terminal for supplying an output signal (Vo1), and a switching stage coupled between the input stage and the output stage, the switching stage comprising a switching transistor having a base coupled to the input stage, having a collector coupled to a first supply terminal, and having an emitter coupled to the output stage, a differential amplifier having a first input for receiving a hold signal (Vh), having a second input for receiving a tracking signal (Vt), having a common terminal coupled to a second supply terminal by means of a current source, having a first output coupled to the base of the switching transistor, and having a second output coupled to the emitter of the switching transistor, and a capacitor coupled between the emitter of the switching transistor and one of the supply terminals, characterised in that the output stage comprises a first output transistor having a base coupled to the emitter of the switching transistor, having a collector coupled to the first supply terminal, and having an emitter coupled to the second supply terminal, a first current source switched by the tracking signal (Vt) and coupled between the emitter of the first output transistor and the second supply terminal, a second output transistor having a base coupled to the emitter of the first output transistor, having a collector coupled to the first supply terminal, and having an emitter coupled to the output terminal and to the second terminal, and a second current source coupled between the emitter of the second output transistor and the second supply terminal.

14. A track-and-hold circuit as claimed in claim 13, wherein the input stage comprises a passive impedance coupled between the base of the switching transistor and the first supply terminal, and the input stage is adapted to supply a signal current to the base of the switching transistor, which signal current is related to the input signal applied to the input terminal.

15. A track-and-hold circuit as claimed in claim 13, wherein the input stage, the output stage and the switching stage comprise differential stages.

16. A track-and-hold circuit as claimed in claim 15, wherein the input stage comprises a degenerate differential amplifier having a first and a second input coupled to respective input terminals for receiving a differential input signal (Vi1, Vi2), having a common terminal coupled to the second supply terminal by means of a current source, and having a first and second output coupled to the bases of respective switching transistors, and the respective passive impedances each comprising a resistor connected in series with a respective unidirectional element.

17. A track-and-hold circuit as claimed in claim 16, wherein common terminals of respective differential amplifiers of the switching stage are coupled to one another, and current sources are combined.

18. A track-and-hold circuit as claimed in claim 1, which further comprises a first and a second feedforward capacitor, the first feedforward capacitor being coupled between the emitter of the one switching transistor and the base of the other switching transistor, and the second feedforward capacitor being coupled between the emitter of the other switching transistor and the base of the one switching transistor.

19. A track-and-hold circuit as claimed in claim 18 wherein the first and the second feedforward capacitor each comprise two circuits coupled in parallel, which circuits each comprise a second pair of unidirectional elements coupled in series opposition.

* * * * *